US012583189B2

(12) United States Patent
Lu et al.

(10) Patent No.: US 12,583,189 B2
(45) Date of Patent: Mar. 24, 2026

(54) BONDING FOR HIGH-TEMPERATURE COMPOSITE APPLICATIONS

(71) Applicant: Rohr, Inc., Chula Vista, CA (US)

(72) Inventors: Weiming Lu, Copley, OH (US); Iwona Wrobel, East Hartford, CT (US); Vijay V. Pujar, San Diego, CA (US); Katherine E. Waugh, San Diego, CA (US)

(73) Assignee: GOODRICH CORPORATION, Charlotte, NC (US)

( * ) Notice: Subject to any disclaimer, the term of this patent is extended or adjusted under 35 U.S.C. 154(b) by 160 days.

(21) Appl. No.: 18/329,452

(22) Filed: Jun. 5, 2023

(65) Prior Publication Data

US 2024/0399671 A1 Dec. 5, 2024

(51) Int. Cl.
| *B29C 65/48* | (2006.01) |
| *B29C 65/72* | (2006.01) |
| *C08K 3/04* | (2006.01) |
| *C08K 7/04* | (2006.01) |
| *C09J 5/00* | (2006.01) |
(Continued)

(52) U.S. Cl.
CPC ........ B29C 65/483 (2013.01); B29C 65/4865 (2013.01); B29C 65/72 (2013.01); C09J 5/00 (2013.01); C09J 5/02 (2013.01); C09J 5/06 (2013.01); C09J 9/00 (2013.01); C09J 11/04 (2013.01); C09J 171/10 (2013.01); C23C 16/045 (2013.01); C08K 3/04 (2013.01); C08K 7/04 (2013.01); C09J 2301/312 (2020.08);
(Continued)

(58) Field of Classification Search
CPC . B29B 11/16; B29C 65/483; C04B 2235/614;

C04B 2237/086; C08K 3/04; C08K 7/04; C09J 11/04; C09J 171/10; C09J 2301/312; C23C 16/045
USPC ...... 156/60, 77, 78, 79, 89.11, 89.25, 89.26, 156/91, 92, 153, 155, 272.2, 272.6, 273.3, 156/276
See application file for complete search history.

(56) References Cited

U.S. PATENT DOCUMENTS

| 5,382,309 A | * | 1/1995 | Seibold | ............. | C04B 35/63428 |
| | | | | | 264/29.7 |
| 5,439,627 A | * | 8/1995 | De Jager | ............... | B29C 70/025 |
| | | | | | 264/129 |
(Continued)

FOREIGN PATENT DOCUMENTS

| CN | 106634744 | 5/2017 |
| CN | 112406213 | 2/2021 |
(Continued)

OTHER PUBLICATIONS

European Patent Office, European Search Report dated Jan. 14, 2025 in Application No. 24179713.3.
(Continued)

*Primary Examiner* — Jennifer A Boyd
(74) *Attorney, Agent, or Firm* — SNELL & WILMER L.L.P.

(57) ABSTRACT

A manufacturing method is provided. The manufacturing method applies a bonding adhesive to at least one of the first surface of the first composite preform component or the first surface of the second composite preform component, and joins the first surface of the first composite preform component to the first surface of the second composite preform component.

17 Claims, 6 Drawing Sheets

(51) Int. Cl.

| | |
|---|---|
| *C09J 5/02* | (2006.01) |
| *C09J 5/06* | (2006.01) |
| *C09J 9/00* | (2006.01) |
| *C09J 11/04* | (2006.01) |
| *C09J 171/10* | (2006.01) |
| *C23C 16/04* | (2006.01) |

(52) U.S. Cl.
CPC ...... *C09J 2301/408* (2020.08); *C09J 2301/50* (2020.08); *C09J 2471/00* (2013.01)

(56) References Cited

U.S. PATENT DOCUMENTS

| | | | |
|---|---|---|---|
| 5,547,654 A | 8/1996 | Machida et al. | |
| 5,928,448 A * | 7/1999 | Daws | B23P 6/00 |
| | | | 156/92 |
| 6,030,913 A * | 2/2000 | Heine | C04B 35/80 |
| | | | 501/88 |
| 7,384,663 B2 | 6/2008 | Olry et al. | |
| 8,143,363 B2 | 3/2012 | Taden et al. | |
| 8,632,651 B1 * | 1/2014 | Hicks | B29C 66/54 |
| | | | 156/272.2 |
| 9,133,365 B2 | 9/2015 | Dan-Jumbo et al. | |
| 9,416,302 B2 | 8/2016 | Salnikov et al. | |
| 9,777,155 B2 | 10/2017 | Arai et al. | |
| 2004/0110041 A1 * | 6/2004 | Merrill | F23R 3/007 |
| | | | 156/89.12 |
| 2005/0255335 A1 * | 11/2005 | Suyama | C04B 35/565 |
| | | | 264/643 |
| 2016/0023957 A1 * | 1/2016 | Landwehr | B23K 1/20 |
| | | | 156/499 |

| | | | |
|---|---|---|---|
| 2016/0264478 A1 * | 9/2016 | Crooks | C04B 37/025 |
| 2016/0289127 A1 * | 10/2016 | Ackerman | C04B 37/008 |
| 2024/0253333 A1 * | 8/2024 | Dunn | C04B 37/008 |

FOREIGN PATENT DOCUMENTS

| | | |
|---|---|---|
| CN | 115403400 | 11/2022 |
| EP | 3063107 | 12/2020 |
| EP | 3766691 | 1/2021 |
| FR | 3040909 | 3/2017 |

OTHER PUBLICATIONS

European Patent Office, European Partial Search Report dated Oct. 18, 2024 in Application No. 24179713.3.

Hsiao K-T et al: "Use of Epoxy/Multiwalled Carbon Nanotubes as Adhesives To Join Graphite Fibre Reinforced Polymer Composites", Nanotechnology, IOP Publishing, England, vol. 14, No. 7, Jul. 1, 2003 (Jul. 1, 2003), pp. 791-793, XP001169320, ISSN: 0957-4484, DOI: 10.1088/0957-4484/14/7/316.

Vietri U et al: "Nanofilled epoxy adhesive for structural aeronautic materials", Composites Part B, Elsevier, Amsterdam, NL, vol. 61, Jan. 27, 2014 (Jan. 27, 2014), pp. 73-83, XP028657686, ISSN: 1359-8368, DOI: 10.1016/J.COMPOSITESB.2014.01.032.

Anonymous Hasan Hüseyin et al: "Characterization and Adhesive Performance of Phenol-Formaldehyde Resol Resin Reinforced with Carbon Nanotubes", Bioresources, vol. 17, No. 3, Jun. 30, 2022 (Jun. 30, 2022), pp. 4781-4792, XP093339953, US ISSN: 1930-2126, DOI: 10.15376/biores.17.3.4781-4792.

European Patent Office, European Search Report dated Dec. 4, 2025 in Application No. 24179713.3.

* cited by examiner

302

102a,
104a

402

102a,
104a

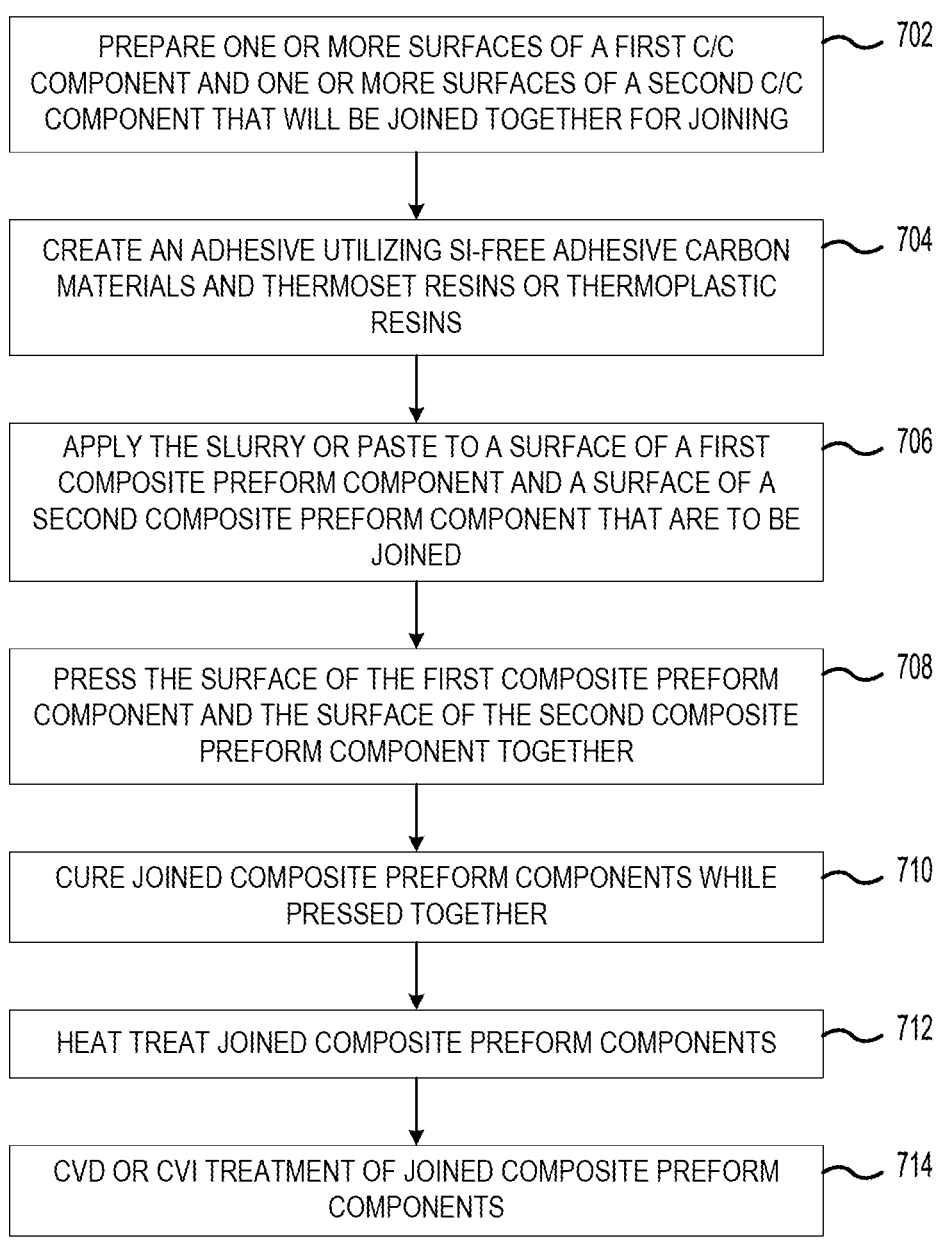

PREPARE ONE OR MORE SURFACES OF A FIRST C/C COMPONENT AND ONE OR MORE SURFACES OF A SECOND C/C COMPONENT THAT WILL BE JOINED TOGETHER FOR JOINING — 702

CREATE AN ADHESIVE UTILIZING SI-FREE ADHESIVE CARBON MATERIALS AND THERMOSET RESINS OR THERMOPLASTIC RESINS — 704

APPLY THE SLURRY OR PASTE TO A SURFACE OF A FIRST COMPOSITE PREFORM COMPONENT AND A SURFACE OF A SECOND COMPOSITE PREFORM COMPONENT THAT ARE TO BE JOINED — 706

PRESS THE SURFACE OF THE FIRST COMPOSITE PREFORM COMPONENT AND THE SURFACE OF THE SECOND COMPOSITE PREFORM COMPONENT TOGETHER — 708

CURE JOINED COMPOSITE PREFORM COMPONENTS WHILE PRESSED TOGETHER — 710

HEAT TREAT JOINED COMPOSITE PREFORM COMPONENTS — 712

CVD OR CVI TREATMENT OF JOINED COMPOSITE PREFORM COMPONENTS — 714

FIG.7

BONDING FOR HIGH-TEMPERATURE COMPOSITE APPLICATIONS

FIELD

The present disclosure relates generally to composite preform components and, more particularly, to bonding for high-temperature composite applications.

BACKGROUND

Shaped composite bodies are utilized in aerospace applications. Various systems and methods are known in the art for joining composite preform components. Many methods for joining or bonding of a carbon-carbon (C/C) part to another C/C part used for high-temperature applications utilize resins and resin mixtures containing silicon (Si)-based or silicon carbide (SiC)-based compounds.

SUMMARY

According to various embodiments of the present disclosure, a manufacturing method is provided. The method includes applying a bonding adhesive to at least one of a first surface of a first composite preform component or a first surface of a second composite preform component; and joining the first surface of the first composite preform component to the first surface of the second composite preform component.

In various embodiments, the bonding adhesive is silicon-free and includes at least one of a thermoset resin or a thermoplastic resin. In various embodiments, the thermoset resin is at least one of a phenolic-based resin, a polyimide-based resin, or a polybenzoxazine-based resin. In various embodiments, the thermoplastic resin is at least one of an isotropic pitch, mesophase pitch, polyetheretherketone (PEEK), or polyaryleetherketones (PAEK). In various embodiments, the bonding adhesive is reinforced with at least one of chopped carbon fiber, carbon nanotubes, carbon nanofibers, graphene, or powdered diamond dust. In various embodiments, the at least one of the first surface of the first composite preform component or the first surface of the second composite preform component are prepared by surface etching the at least one of the first surface of the first composite preform component and the first surface of the second composite preform component. In various embodiments, the surface etching includes at least one of high-temperature burning, physical scratching, surface grinding, or plasma deformation.

In various embodiments, the at least one of the first surface of the first composite preform component or the first surface of the second composite preform component are prepared by growing carbon nanofibers or carbon nanotubes on the at least one of the first surface of the first composite preform component or the first surface of the second composite preform component. In various embodiments, the at least one of the first surface of the first composite preform component or the first surface of the second composite preform component are prepared by drilling holes in the first surface of the first composite preform component and the first surface of the second composite preform component for joining using a set of internal carbon dowels. In various embodiments, the at least one of the first surface of the first composite preform component or the first surface of the second composite preform component are prepared by an introduction of nitrogen (N) or sulfur(S) compounds directly on the at least one of the first surface of the first composite preform component or the first surface of the second composite preform component. In various embodiments, the at least one of the first surface of the first composite preform component or the first surface of the second composite preform component are prepared by cold spraying the at least one of the first surface of the first composite preform component or the first surface of the second composite preform component with a carbon powder.

Also disclosed herein is a manufacturing method that includes preparing at least one of a first surface of a first composite preform component or a first surface of a second composite preform component for joining; applying a bonding adhesive to the at least one of the first surface of the first composite preform component or the first surface of the second composite preform component; pressing the first surface of the first composite preform component and the first surface of the second composite preform component together to form a joined composite preform component; curing the joined composite preform component; heat treating the joined composite preform component; and performing either chemical vapor infiltration (CVI) densification or chemical vapor deposition (CVD) on the joined composite preform component.

In various embodiments, the bonding adhesive is silicon free and includes at least one of a thermoset resin or a thermoplastic resin. In various embodiments, the bonding adhesive including the at least one of the thermoset resin or the thermoplastic resin further includes a fugitive compound. In various embodiments, the fugitive compound volatilizes and forms porous channels in the bonding adhesive during at least one of the curing or the heat treating and creates pathways for infiltration of gases during a chemical vapor infiltration operation to promote densification and improve a bonding strength. In various embodiments, the thermoset resin is at least one of a phenolic-based resin, a polyimide-based resin, or a polybenzoxazine-based resin. In various embodiments, the thermoplastic resin is at least one of an isotropic pitch, mesophase pitch, polyetheretherketone (PEEK), or polyaryleetherketones (PAEK). In various embodiments, the bonding adhesive is reinforced with at least one of chopped carbon fiber, carbon nanotubes, carbon nanofibers, graphene, or powdered diamond dust.

In various embodiments, the at least one of the first surface of the first composite preform component or the first surface of the second composite preform component are prepared by surface etching the at least one of the first surface of the first composite preform component and the first surface of the second composite preform component and wherein the surface etching includes at least one of high-temperature burning, physical scratching, surface grinding, or plasma deformation. In various embodiments, the at least one of the first surface of the first composite preform component or the first surface of the second composite preform component are prepared by growing carbon nanofibers or carbon nanotubes on the at least one of the first surface of the first composite preform component or the first surface of the second composite preform component.

In various embodiments, the at least one of the first surface of the first composite preform component or the first surface of the second composite preform component are prepared by drilling holes in the first surface of the first composite preform component and the first surface of the second composite preform component for joining using a set of internal carbon dowels. In various embodiments, the at least one of the first surface of the first composite preform component or the first surface of the second composite preform component are prepared by an introduction of nitrogen (N) or sulfur(S) compounds directly on the at least one of the first surface of the first composite preform component or the first surface of the second composite preform component. In various embodiments, the at least one of the first surface of the first composite preform component or the first surface of the second composite preform component are prepared by cold spraying the at least one of the first surface of the first composite preform component or the first surface of the second composite preform component with a carbon powder.

Also disclosed herein is a bonding adhesive for joining a first surface of a first composite preform component to a first surface of a second composite preform component. The bonding adhesive includes at least one of a high temperature capable bonding adhesive or melt-resistant bonding adhesive; and at least one of a thermoset resin or a thermoplastic resin.

In various embodiments, the thermoset resin is at least one of a phenolic-based resin, a polyimide-based resin, or a polybenzoxazine-based resin. In various embodiments, the thermoplastic resin is at least one of an isotropic pitch, mesophase pitch, polyetheretherketone (PEEK), or polyaryleetherketones (PAEK). In various embodiments, the bonding adhesive is reinforced with at least one of chopped carbon fiber, carbon nanotubes, carbon nanofibers, graphene, or powdered diamond dust.

The present disclosure may include any one or more of the individual features disclosed above and/or below alone or in any combination thereof.

The foregoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

FIG. 7 illustrates a method of bonding a first C/C component to a second C/C component for high-temperature composite applications, in accordance with various embodiments.

DETAILED DESCRIPTION

Figure 1:
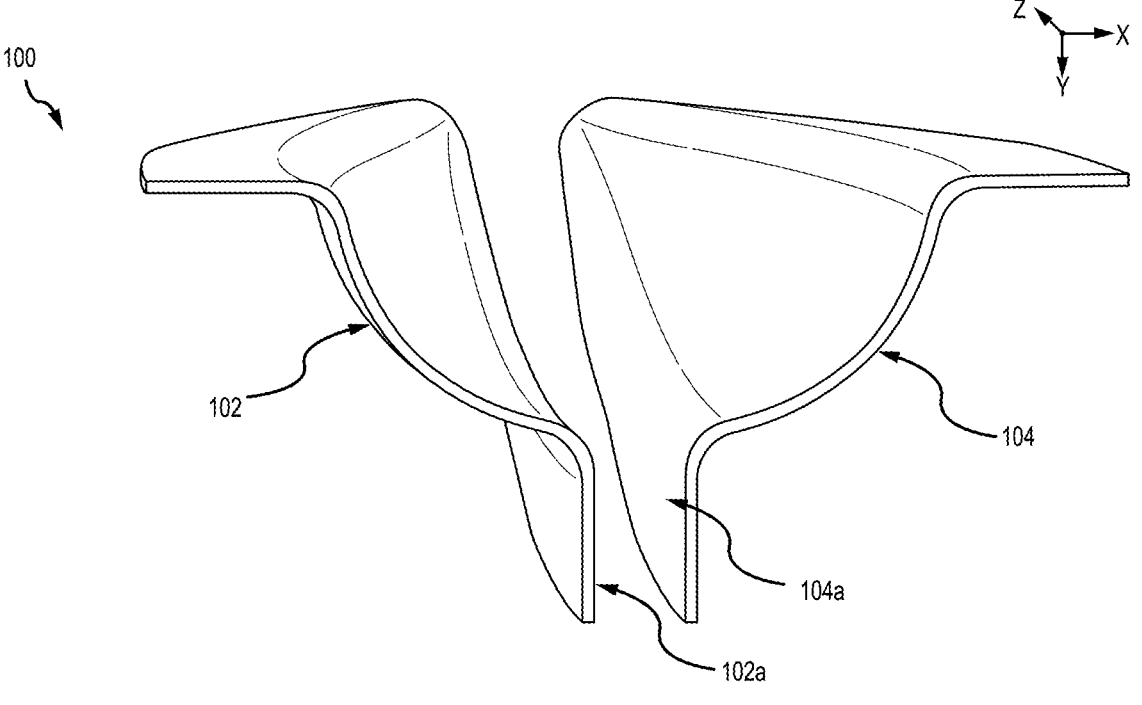
FIG. 1 illustrates a set of composite preform components to be joined together to form all or a portion of a composite structure, in accordance with various embodiments.

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an," or "the" may include one or more than one and that reference to an item in the singular may also include the item in the plural. Further, all ranges may include upper and lower values and all ranges and ratio limits disclosed herein may be combined.

Typical joining or bonding of a carbon-carbon (C/C) part to a monolith or other C/C part used for high-temperature applications utilize phenolic resins, which are silicon (Si)-based or silicon carbide (SiC)-based resins. However, utilizing Si-based or SiC-based resins in the bonding area may cause mismatch issues. That is, phenolic resin bonding provides disadvantages such as low carbon yield (less than 60% yield), low graphitizability (i.e. phenolic resin-based carbon is not very graphitizable), and/or low thermal properties (i.e. thermal conductivity), among others.

Disclosed herein are systems and methods for bonding C/C components for high-temperature composite applications. In various embodiments, silicon-free (Si-free) or pure C/C bonding technology is utilized to bond a first C/C component to a second C/C component for high-temperature structural C/C applications where the operating temperature may reach 4000 degrees fahrenheit (2204 degree Celsius) or above. In various embodiments, the phenolic resins are replaced with a bonding adhesive. In various embodiments, the bonding adhesive may be a high-temperature capable bonding adhesive or a melt-resistant bonding adhesive. In various embodiments, the bonding adhesive may be silicon free. In various embodiments, the bonding adhesive may include a thermoset resin, e.g. a phenolic-based resin, a polyimide-based resin, or a polybenzoxazine-based resin, among others, or a thermoplastic resin, e.g. isotropic pitch, mesophase pitch, polyetheretherketone (PEEK), or polyaryleetherketones (PAEK), among others. In various embodiments, the thermoset and thermoplastic resins may be reinforced by adding, e.g. chopped carbon fiber, carbon nanotubes, carbon nanofibers, graphene, or powdered diamond dust, among others, to the thermoset and thermoplastic resins. In various embodiments, the bonding of the C/C components may be enhanced by growing carbon nanofibers or carbon nanotubes on the surfaces of the bonding areas of the C/C components. In various embodiments, the bonding of the C/C components may be enhanced through the utilization of internal carbon dowels. In various embodiments, the bonding of the C/C components may be enhanced by creating high contact surface areas between the C/C components, e.g. surface roughness. In various embodiments, the bonding of the C/C components may be enhanced by introducing nitrogen ($N_2$) or sulfur(S) compounds directly on the surfaces of the bonding areas of the C/C components. In various embodiments, the bonding of the C/C components may be enhanced by cold spraying the surfaces of the bonding areas of the C/C components with a carbon powder, e.g. isotropic pitch powder or mesophase pitch powder, among others.

Referring now to FIG. 1, in accordance with various embodiments, a set of composite preform components to be joined together to form all or a portion of a composite structure is illustrated. Composite structure 100 includes a first composite preform component 102 and a second composite preform component 104. In various embodiments, both of the first composite preform component 102 and the second composite preform component 104 may have a complex shape having portions formed in in a first direction, i.e., in a x-direction, in a second direction, i.e., in a y-direction, and in a third direction, i.e., a z-direction, or any combination thereof. In various embodiments, parts of the first composite preform component 102 are joined to parts of the second composite preform component 104 to form an even more complex shape. For example, in various embodiments, surface 102a of the first composite preform component 102 may be joined to surface 104a of the second composite preform component 104 via bonding.

Figures 2A, 2B:
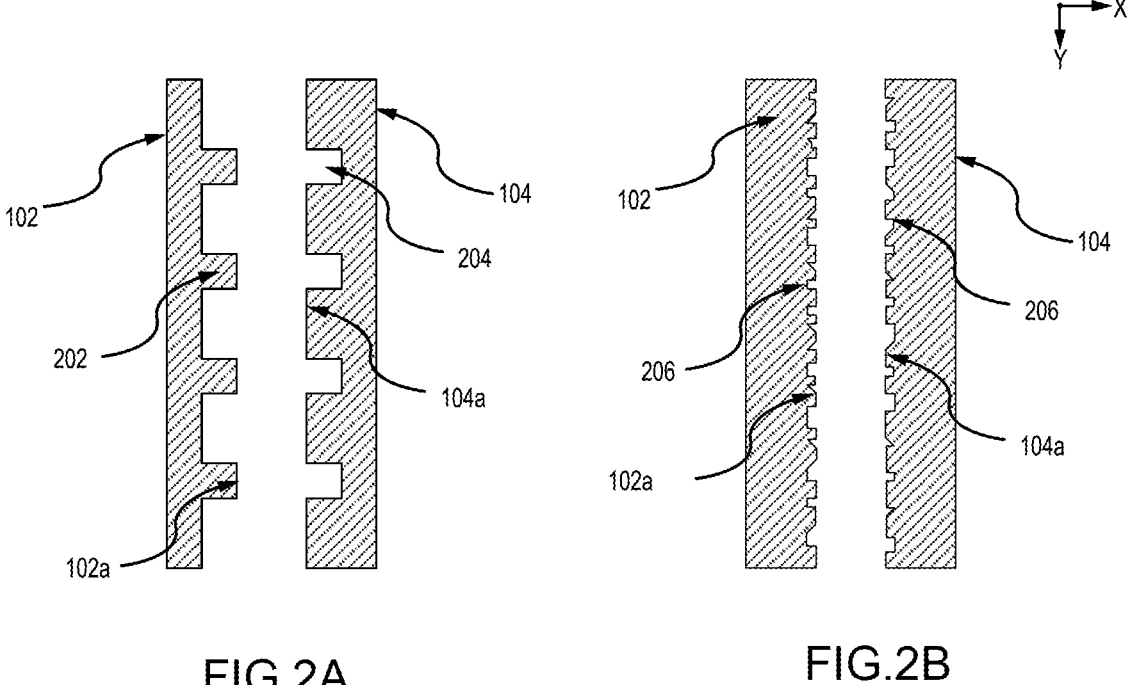
FIGS. 2A and 2B illustrate deformations of a cross section of the surface of the first composite preform component or the surface of the second composite preform component, in accordance with various embodiments.

As described previously, in various embodiments, the bonding of the C/C components may be enhanced by creating high contact surface areas between the C/C components. In various embodiments, the high contact surfaces area having relatively high surface roughness, which increases the total bonding surface area per square meter, may be generated via surface etching performed by high temperature "burning," physical scratching (e.g., with abrasives and/or blasting with abrasive media), surface grinding, or plasma deformation that utilizes oxygen, nitrogen, argon, or air, there by forming a Arithmetic Average Roughness (Ra) value of roughness, such as between 3.2 micrometers (126 microinches) and 1.2 micrometers (47.24 microinches). Turning to FIGS. 2A and 2B, in accordance with various embodiments, deformations of a cross section of the surface 102a of the first composite preform component 102 or the surface 104a of the second composite preform component 104 is illustrated. In various embodiments, the surface 102a or the surface 104a may be deformed from a smooth surface to encompass holes, ridges, or contours, among others. In various embodiments, the deformations may be implemented by using a tool with a high-temperature tip that, when the high-temperature tip contacts the surface 102a or the surface 104a, the surface is deformed from being a smooth surface. In various embodiments, the deformations may be implemented by physically scratching the surface 102a or the surface 104a with a tool so as to deform the surface from a smooth surface state. In various embodiments, the deformations may be implemented by grinding the surface 102a or the surface 104a via a grinding tool or machine that utilizes an abrasive wheel or attachment to remove portions of the surface. In various embodiments, the deformations may be implemented by using a plasma tool that utilizes oxygen, nitrogen, argon, or air, among others, to deform the surface from a smooth surface state.

With particular reference to FIG. 2A, the surface 102a may be deformed to have a set of positive ridges 202 extending in the positive x-direction and surface 104a may be deformed to have a set of negative ridges 204 extending in the positive x-direction such that, responsive to the surface 102a of the first composite preform component 102 and the surface 104a of the second composite preform component 104 being pressed together, the set of positive ridges 202 protrude into the set of negative ridges 204. It is noted that a thermoset resin or a thermoplastic resin may be applied to the surface 102a and/or the surface 104a prior to the surface 102a of the first composite preform component 102 and the surface 104a of the second composite preform component 104 being pressed together.

With particular reference to FIG. 2B, the surface 102a and the surface 104a may be deformed to have a plurality of holes, ridges, or contours 206, among others, some of which may align with each other while others of which do not align with each other. In that regard, responsive to the surface 102a of the first composite preform component 102 and the surface 104a of the second composite preform component 104 being pressed together, a thermoset resin or a thermoplastic resin applied to the surface 102a and/or the surface 104a prior to the surface 102a of the first composite preform component 102 and the surface 104a of the second composite preform component 104 being pressed together, may enter and fill the plurality of holes, ridges, or contours 206, among others, to increase the bonding surface area.

Figures 3, 4:
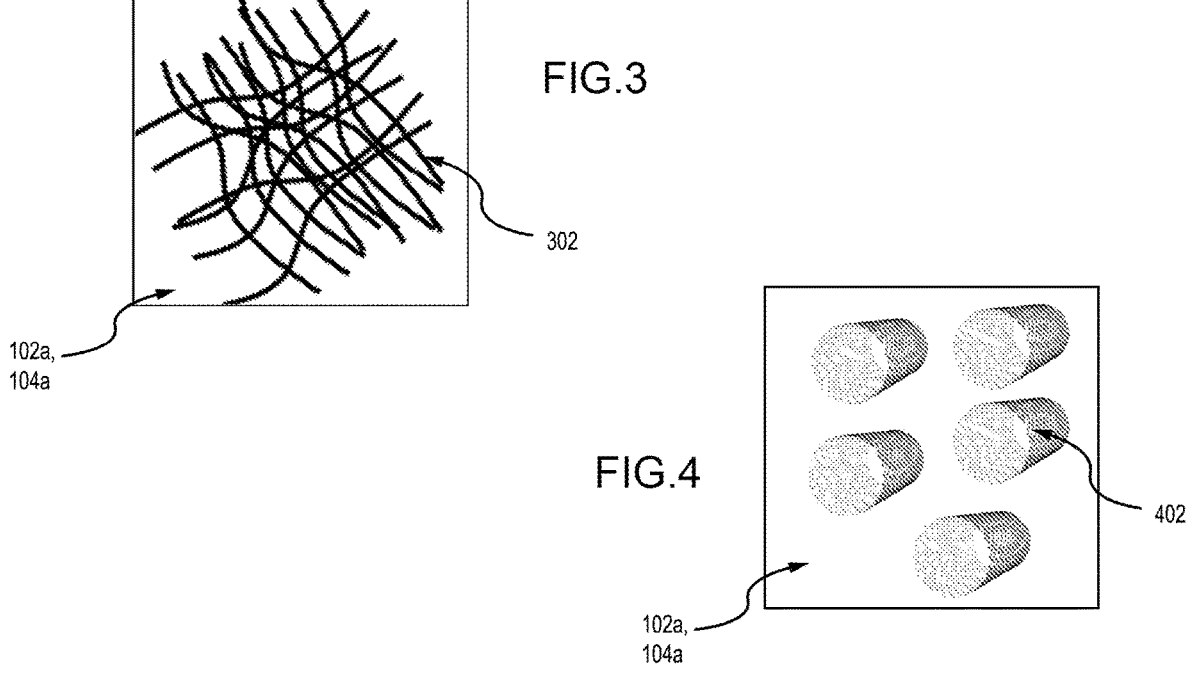
FIG. 3 illustrates carbon fibers grown on a surface of a composite preform component and/or on a surface of a second composite preform component, in accordance with various embodiments.
FIG. 4 illustrates carbon nanotubes grown on a surface of a composite preform component and/or on a surface of a second composite preform component, in accordance with various embodiments.

As described previously, in various embodiments, the bonding of the C/C components may be enhanced by growing carbon nanofibers or carbon nanotubes on the surfaces of the bonding areas of the C/C components. Turning to FIG. 3, in accordance with various embodiments, carbon fibers 302 grown on a surface 102a of a composite preform component and/or on a surface 104a of a second composite preform component are illustrated. In various embodiments, carbon fibers 302 may be grown on the surface 102a and/or the surface 104a by exposing a metal catalyst particle, such as iron (Fe), cobalt (Co), nickel (Ni), among others, of a few nanometers, e.g. between 0.5 nanometers (0.01969 microinch) and 9 nanometers (0.3543 microinch), in diameter to a gas, such as benzene and methane, supersaturated in carbon. Under these conditions, the catalyst particles can produce rapidly lengthening carbon filaments of nanometer diameter. Turning to FIG. 4, in accordance with various embodiments, carbon nanotubes 402 grown on a surface 102a of a composite preform component and/or on a surface 104a of a second composite preform component are illustrated. In various embodiments, carbon fibers 302 may be grown on the surface 102a and/or the surface 104a by exposing a metal catalyst particle, such as iron (Fe), cobalt (Co), nickel (Ni), among others, of a few nanometers, e.g. between 0.5 nanometers (0.01969 microinch) and 9 nanometers (0.3543 microinch), in diameter to a carbon-containing reaction gas, such as hydrogen or carbon monoxide, among others, supersaturated in carbon in a high-temperature furnace.

Figure 5:
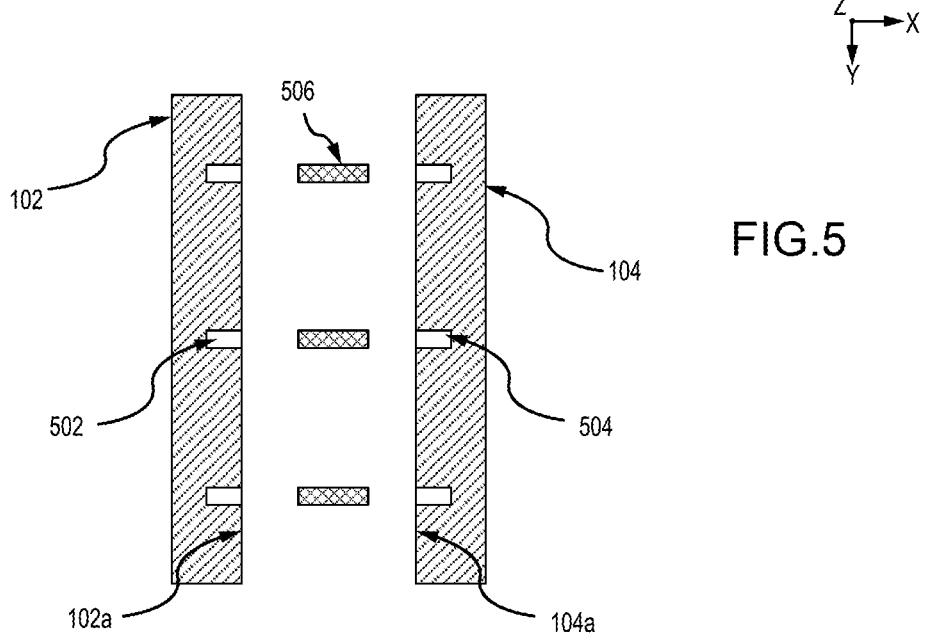
FIG. 5 illustrates a set of holes formed in a first composite preform component and a set of holes formed in a second composite preform component, in accordance with various embodiments.

As described previously, in various embodiments, the bonding of the C/C components may be enhanced through the utilization of internal carbon dowels. Turning to FIG. 5, in accordance with various embodiments, a set of holes 502 formed in a first composite preform component 102 and a set of holes 504 formed in a second composite preform component 104 is illustrated. In various embodiments, the set of holes 502 of a first diameter may be formed by drilling or etching, among others, from a surface 102a into the first composite preform component 102 in a negative x-direction. In various embodiments, the set of holes 504 of a second diameter may be formed by drilling or etching, among others, from a surface 104a into the second composite preform component 104 in a positive x-direction. In various embodiments, the first diameter is equal to the second diameter. In various embodiments, a set of carbon dowels 506 may be formed that have a third diameter that is substantially equal to the first and second diameters. In various embodiments, the terms "substantially" as used herein represents an amount close to the stated amount that still performs a desired function or achieves a desired result. For example, the term "substantially" may refer to an amount that is within 10% of, within 5% of, within 1% of, within 0.1% of, and within 0.01% of a stated amount or value. In various embodiments, responsive to the surface 102a of the first composite preform component 102 and the surface 104a of the second composite preform component 104 being pressed together, set of carbon dowels 506 enter respective ones of the set of holes 502 and the set of holes 504. In that regard, responsive to the surface 102a of the first composite preform component 102 or the surface 104a of the second composite preform component 104 being pressed together, a thermoset resin or a thermoplastic resin applied to the surface 102a and the set of holes 502, the surface 104a and the set of holes 504, and/or the carbon dowels 506 prior to the surface 102a of the first composite preform component 102 or the surface 104a of the second composite preform component 104 being pressed together, may enter and fill the set of holes 502 and the set of holes 504 to increase the bonding to the respective ones of the set of carbon dowels 506. In various embodiments, each of the set of holes may be up to half the thickness of the first composite preform component 102 or the second composite preform component 104.

Figure 6:
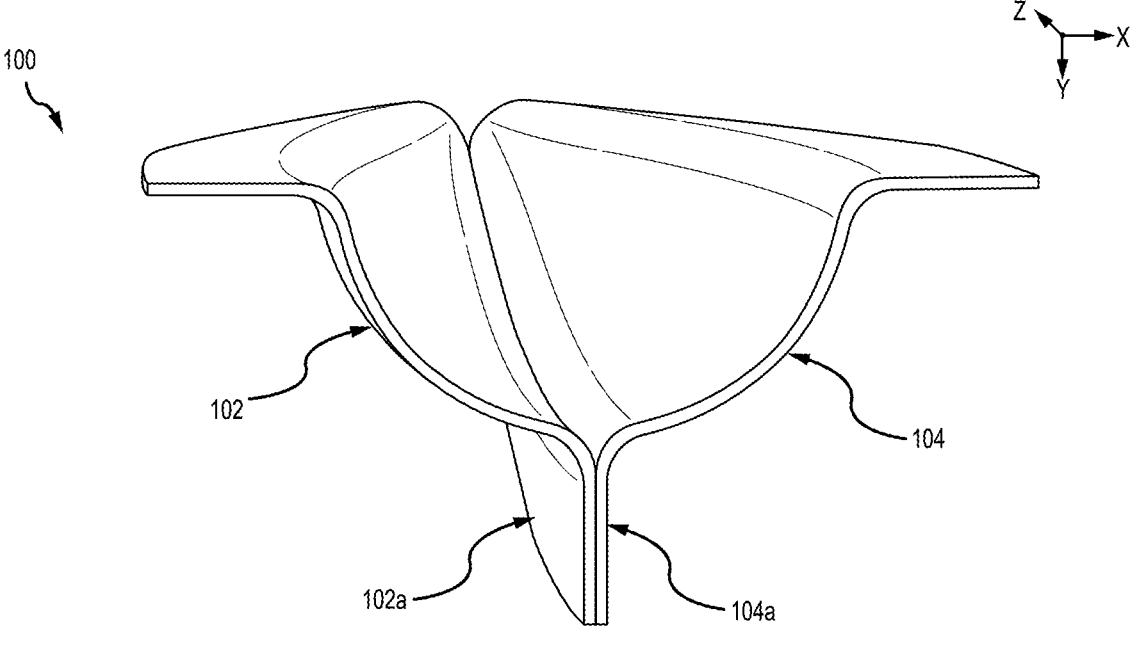
FIG. 6 illustrates a set of composite preform components joined together to form all or a portion of a composite structure, in accordance with various embodiments.

Turning to FIG. 6, in accordance with various embodiments, a set of composite preform components joined together to form all or a portion of a composite structure is illustrated. In various embodiments, surface 102a of the first composite preform component 102 is joined to surface 104a of the second composite preform component 104 via bonding.

Referring now to FIG. 7, in accordance with various embodiments, a method of bonding a first C/C component to a second C/C component for high-temperature composite applications, is illustrated. At block 702, one or more surfaces of the first C/C component and one or more surfaces of the second C/C component that will be joined together are prepared for joining. In various embodiments, the one or more surfaces of the first C/C component and the one or more surfaces of the second C/C component may be prepared via surface etching performed by high temperature "burning." physical scratching (e.g., with abrasives and/or blasting with abrasive media), surface grinding, or plasma deformation that utilizes oxygen, nitrogen, argon, or air, there by forming a Ra value of roughness, such as between 3.2 micrometers (126 microinches) and 1.2 micrometers (47.24 microinches). In various embodiments, the one or more surfaces of the first C/C component and the one or more surfaces of the second C/C component may be prepared via growing carbon nanofibers or carbon nanotubes on the surfaces of the bonding areas of the C/C components. In various embodiments, the one or more surfaces of the first C/C component and the one or more surfaces of the second C/C component may be prepared via a utilization of internal carbon dowels. In various embodiments, the one or more surfaces of the first C/C component and the one or more surfaces of the second C/C component may be prepared via an introduction of nitrogen (N) or sulfur(S) compounds directly on the surfaces of the bonding areas of the C/C components. In various embodiments, the one or more surfaces of the first C/C component and the one or more surfaces of the second C/C component may be prepared via cold spraying the surfaces of the bonding areas of the C/C components with a carbon powder, e.g. isotropic pitch powder or mesophase pitch powder, among others.

At block 704, an adhesive, such as a slurry or paste, may be created utilizing a bonding adhesive. In various embodiments, the bonding adhesive may be a high-temperature capable bonding adhesive or a melt-resistant bonding adhesive. In various embodiments, the bonding adhesive may be silicon free. In various embodiments, the bonding adhesive may include thermoset resins, e.g. a phenolic-based resin, a polyimide-based resin, or a polybenzoxazine-based resins, or thermoplastic resins, e.g. isotropic pitch, mesophase pitch, polyetheretherketone (PEEK), or polyaryleetherketones (PAEK), among others. In various embodiments, the bonding adhesive including the thermoset resin or the thermoplastic resin may further include a fugitive compound. In various embodiments, the fugitive compound volatilizes and forms porous channels in the bonding adhesive during at least one of curing or a heat-treating process and creates pathways for infiltration of gases during a chemical vapor infiltration operation to promote densification and improve a bonding strength. In various embodiments, the slurry or paste may be reinforced by adding, e.g. chopped carbon fiber, carbon nanotubes, carbon nanofibers, graphene, or powdered diamond dust, among others to the thermoset and thermoplastic resins.

At block 706, the slurry or paste may be applied to a surface of a first composite preform component and a surface of a second composite preform component that are to be joined. At block 708, the surface of the first composite preform component and the surface of the second composite preform component are pressed together. In various embodiments, the composite preforms may be pressed together by vacuum-bagging (i.e., negative pressure) or using vacuum bagging and autoclave pressure (i.e., positive pressure). In various embodiments, the composite preforms may be pressed together using flexible caul plates and pressurized bladders or using an actuated platen press, among others, to apply uniform pressure and compaction.

At block 710, once the composite components are pressed together, the joined composite preform component may be cured. At block 712, once cured, the joined composite preform component may be heat treated with temperatures that reach 4000 degrees fahrenheit (2204 degree Celsius) or above. At block 714, the joined composite preform component may then undergo chemical vapor infiltration (CVI) densification or chemical vapor deposition (CVD). CVI is a technique where the joined composite preform component are infiltrated using reactive gases at elevated temperature to form fiber-reinforced joined composite preform component. CVD is a technique in which substances that are in vapor phase are condensed into the joined composite preform component to generate a solid phase material.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C. B and C, or A and B and C.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about," or "approximately" as used herein represent an amount close to the stated amount that still performs a desired function or achieves a desired result. For example, the term "substantially," "about," or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above-described concepts can be used alone or in combination with any or all of the other above-described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A manufacturing method, comprising:
   applying a bonding adhesive to at least one of a first surface of a first composite preform component or a first surface of a second composite preform component,

10 wherein the at least one of the first surface of the first composite preform component or the first surface of the second composite preform component are prepared by cold spraying the at least one of the first surface of the first composite preform component or the first surface of the second composite preform component with a carbon powder; and joining the first surface of the first composite preform component to the first surface of the second composite preform component.

2. The manufacturing method of claim 1, wherein the bonding adhesive is silicon-free and includes at least one of a thermoset resin or a thermoplastic resin.

3. The manufacturing method of claim 2, wherein the thermoset resin is at least one of a phenolic-based resin, a polyimide-based resin, or a polybenzoxazine-based resin and wherein the thermoplastic resin is at least one of an isotropic pitch, mesophase pitch, polyetheretherketone (PEEK), or polyaryletherketones (PAEK).

4. The manufacturing method of claim 1, wherein the bonding adhesive is reinforced with at least one of chopped carbon fiber, carbon nanotubes, carbon nanofibers, graphene, or powdered diamond dust.

5. The manufacturing method of claim 1, wherein the at least one of the first surface of the first composite preform component or the first surface of the second composite preform component are prepared by surface etching the at least one of the first surface of the first composite preform component and the first surface of the second composite preform component.

6. The manufacturing method of claim 5, wherein the surface etching includes at least one of high-temperature burning, physical scratching, surface grinding, or plasma deformation.

7. The manufacturing method of claim 1, wherein the at least one of the first surface of the first composite preform component or the first surface of the second composite preform component are further prepared by growing carbon nanofibers or carbon nanotubes on the at least one of the first surface of the first composite preform component or the first surface of the second composite preform component.

8. The manufacturing method of claim 1, wherein the at least one of the first surface of the first composite preform component or the first surface of the second composite preform component are further prepared by drilling holes in the first surface of the first composite preform component and the first surface of the second composite preform component for joining using a set of internal carbon dowels.

9. The manufacturing method of claim 1, wherein the at least one of the first surface of the first composite preform component or the first surface of the second composite preform component are further prepared by an introduction of nitrogen (N) or sulfur(S) compounds directly on the at least one of the first surface of the first composite preform component or the first surface of the second composite preform component.

10. A manufacturing method, comprising:
   preparing at least one of a first surface of a first composite preform component or a first surface of a second composite preform component for joining, wherein the at least one of the first surface of the first composite preform component or the first surface of the second composite preform component are prepared by cold spraying the at least one of the first surface of the first composite preform component or the first surface of the second composite preform component with a carbon powder;

applying a bonding adhesive to the at least one of the first surface of the first composite preform component or the first surface of the second composite preform component;

pressing the first surface of the first composite preform component and the first surface of the second composite preform component together to form a joined composite preform component;

curing the joined composite preform component;

heat treating the joined composite preform component; and performing either chemical vapor infiltration (CVI) densification or chemical vapor deposition (CVD) on the joined composite preform component.

11. The manufacturing method of claim 10, wherein the bonding adhesive is silicon free and includes at least one of a thermoset resin or a thermoplastic resin, wherein the bonding adhesive comprising the at least one of the thermoset resin or the thermoplastic resin further comprises a fugitive compound, and wherein the fugitive compound volatilizes and forms porous channels in the bonding adhesive during at least one of the curing or the heat treating and creates pathways for infiltration of gases during a chemical vapor infiltration operation to promote densification and improve a bonding strength.

12. The manufacturing method of claim 11, wherein the thermoset resin is at least one of a phenolic-based resin, a polyimide-based resin, or a polybenzoxazine-based resin and wherein the thermoplastic resin is at least one of an isotropic pitch, mesophase pitch, polyetheretherketone (PEEK), or polyaryletherketones (PAEK).

13. The manufacturing method of claim 10, wherein the bonding adhesive is reinforced with at least one of chopped carbon fiber, carbon nanotubes, carbon nanofibers, graphene, or powdered diamond dust.

14. The manufacturing method of claim 10, wherein the at least one of the first surface of the first composite preform component or the first surface of the second composite preform component are prepared by surface etching the at least one of the first surface of the first composite preform component and the first surface of the second composite preform component and wherein the surface etching includes at least one of high-temperature burning, physical scratching, surface grinding, or plasma deformation.

15. The manufacturing method of claim 10, wherein the at least one of the first surface of the first composite preform component or the first surface of the second composite preform component are further prepared by growing carbon nanofibers or carbon nanotubes on the at least one of the first surface of the first composite preform component or the first surface of the second composite preform component.

16. The manufacturing method of claim 10, wherein the at least one of the first surface of the first composite preform component or the first surface of the second composite preform component are further prepared by drilling holes in the first surface of the first composite preform component and the first surface of the second composite preform component for joining using a set of internal carbon dowels.

17. The manufacturing method of claim 10, wherein the at least one of the first surface of the first composite preform component or the first surface of the second composite preform component are further prepared by an introduction of nitrogen (N) or sulfur(S) compounds directly on the at least one of the first surface of the first composite preform component or the first surface of the second composite preform component.

* * * * *